United States Patent [19]

Mizutani

[11] 4,383,883
[45] May 17, 1983

[54] METHOD FOR FABRICATING SEMICONDUCTOR DEVICE

[75] Inventor: Yoshihisa Mizutani, Tokyo, Japan

[73] Assignee: Tokyo Shibaura Denki Kabushiki Kaisha, Kawasaki, Japan

[21] Appl. No.: 289,962

[22] Filed: Aug. 4, 1981

[30] Foreign Application Priority Data

Aug. 11, 1980 [JP] Japan ................................ 55-110012

[51] Int. Cl.$^3$ ................................................ C30B 1/02
[52] U.S. Cl. .................................... 156/603; 156/606; 156/DIG. 80; 156/DIG. 102; 156/DIG. 111
[58] Field of Search ................ 156/603, 610, 612-614, 156/DIG. 80, DIG. 88, DIG. 102, 606, DIG. 111; 148/175; 427/86, 87, 95

[56] References Cited

U.S. PATENT DOCUMENTS

| 3,341,361 | 9/1967 | Gorski | 156/DIG. 88 |
|---|---|---|---|
| 3,348,962 | 10/1967 | Grossman et al. | 156/DIG. 88 |
| 3,549,432 | 12/1970 | Sivertsen | 156/DIG. 80 |
| 3,585,088 | 6/1971 | Schwuttke et al. | 156/DIG. 80 |
| 3,655,439 | 4/1972 | Seiter | 156/603 |
| 4,046,618 | 9/1977 | Chaudhari et al. | 156/603 |
| 4,058,418 | 11/1977 | Lindmayer | 156/DIG. 88 |
| 4,196,041 | 4/1980 | Baghdadi et al. | 156/DIG. 80 |
| 4,330,363 | 5/1982 | Biegesen et al. | 156/DIG. 88 |
| 4,333,792 | 6/1982 | Smith | 156/DIG. 88 |

OTHER PUBLICATIONS

Bean et al., "Epitaxial Layer Crystallization", published in App. Phys. Lett. (33), Aug. 1, 1978, pp. 227-230.
Gat et al., "CW Laser Anneal", published in Appl. Phys. Lett. (33), Oct. 15, 1978, pp. 775-778.
M. W. Geis et al., "Crystallographic Orientation of Silicon on an Amorphous Substrate Using an Artificial Surface-Relief Grating and Laser Crystallization," Appl. Phys. Lett., vol. 35, pp. 71-74, Jul. 1, 1979.
M. Tamura et al., "Si Bridging Epitaxy from Si Windows onto SiO$_2$ by Q-Switched Ruby Laser Pulse Annealing," Jpn. J. Appl. Phys., vol. 19, pp. L23-26, Jan. 1980.

Primary Examiner—Hiram H. Bernstein
Attorney, Agent, or Firm—Finnegan, Henderson, Farabow, Garrett & Dunner

[57] ABSTRACT

A method is provided for fabricating a semiconductor device comprising the steps of: forming a groove on the surface of an insulator body; forming a polycrystalline or amorphous semiconductor layer on the surface of said insulator body including said groove; irradiating part of said semiconductor layer on said groove with an energy beam to convert said part into single crystals; and irradiating the remaining part of said semiconductor layer with said energy beam while displacing said energy beam to thereby sequentially form single crystals utilizing said single crystal semiconductor layer as a growing nucleus so as to form a continuous single crystal semiconductor on said insulator body. The method of the invention allows photolithography with good precision.

8 Claims, 10 Drawing Figures

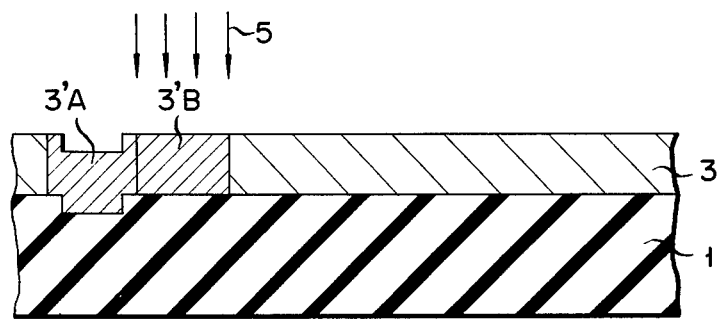
F I G. 5
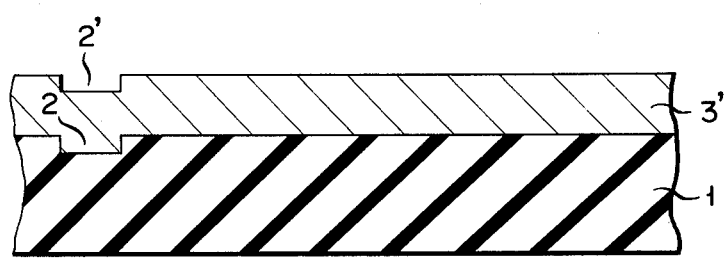
F I G. 6
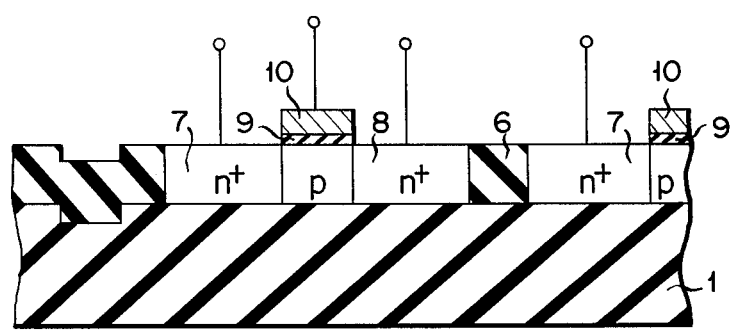
F I G. 7

METHOD FOR FABRICATING SEMICONDUCTOR DEVICE

BACKGROUND OF THE INVENTION

The present invention relates to a method for fabricating a semiconductor device. More particularly, the present invention relates to a method for fabricating a semiconductor device including the step of turning a polycrystalline or amorphous semiconductor layer formed on an insulator body into a single crystal layer.

As a semiconductor device in which a semiconductor layer is formed on an insulator body, an integrated circuit (IC) is known wherein a silicon dioxide film is formed on the surface of a single crystal silicon substrate, a silicon layer is formed thereover by the CVD process, and the resultant silicon layer is utilized as a gate electrode or a wiring layer. A semiconductor device of SOS structure is also known wherein a silicon layer is epitaxially grown on a sapphire substrate and elements are formed in this epitaxially grown silicon layer. However, the silicon layer formed on the silicon dioxide film by the CVD process or the like does not become a single crystal layer but becomes a polycrystalline silicon layer having a relatively high resistance. For this reason, a semiconductor device utilizing this silicon layer as the gate electrode or as wiring has been defective in that the operating speed is reduced. Furthermore, with an SOS type semiconductor device as described above, when the surface of the sapphire substrate used has an incomplete crystal plane, the silicon layer epitaxially grown thereover will have corresponding crystal defects. Therefore, only sapphire substrates of high quality can be used.

A method has been proposed to overcome these problems by converting the polycrystalline silicon layer deposited on the silicon dioxide film or the like into a single crystal layer. An example of this method is known as "graphoepitaxy", to be described below. According to the graphoepitaxy method, a number of grooves having side walls at right angles to the film surface are formed on the entire surface of the insulating film such as a silicon dioxide film. A polycrystalline silicon layer is deposited on this insulating film. This polycrystalline silicon layer is irradiated with an energy beam such as a laser beam to be melted and resolidified in a short period of time. When the polycrystalline silicon layer deposited on the silicon dioxide film having a flat surface is irradiated with the energy beam to be melted and resolidified, it is known that the resolidified silicon tends to grow with its crystal plane (100) oriented in the direction perpendicular to the surface of the silicon dioxide film. In this case, crystal growth in the direction parallel to the surface of the silicon dioxide film is not facilitated. Therefore, only a polycrystalline silicon layer consisting of many crystal grains having a crystal plane (100) in the direction perpendicular to the surface of the silicon dioxide film can be formed. In order to solve this problem, according to the graphoepitaxy method, crystal growth of the resolidified silicon in the horizontal direction (in the direction parallel to the surface of the silicon dioxide film) is facilitated by many grooves formed on the surface of the silicon dioxide film, whereby a single crystal layer of uniform orientation may be formed. In this case, the crystal grows such that the crystal plane (010) is oriented along the longitudinal direction of the grooves and the crystal plane (001) is oriented in the direction perpendicular to the longitudinal direction of the grooves.

Apart from the effects obtained as described above, the surface of the single crystal silicon layer formed by the graphoepitaxy method as described above has a three-dimensional pattern corresponding to the grooves on the surface of the silicon dioxide film. This presents big problems in the patterning of this silicon layer to form electrodes and wiring or in forming semiconductor elements in this silicon layer. The presence of such a three-dimensional pattern entails nonuniformity in the pattern size in the process of photolithography, due to differences in the focal distances. Reflection from the end faces of the three-dimensional pattern also significantly degrades the precision in photolithography.

SUMMARY OF THE INVENTION

It is an object of the present invention to provide a method for fabricating a semiconductor device wherein most of the surface of a single crystal layer formed on an insulator body is flat so that photolithography may be practiced with excellent precision.

According to a first aspect of the present invention, there is provided a method for fabricating a semiconductor device comprising the steps of: forming a groove on the surface of an insulator body; forming a polycrystalline or amorphous semiconductor layer on the surface of said insulator body including said groove; irradiating part of said semiconductor layer formed on said groove with an energy beam to convert said part into single crystals; and irradiating the remaining part of said semiconductor layer with said energy beam while displacing the energy beam to thereby sequentially form single crystals utilizing said single crystal semiconductor layer as a growing nucleus so as to form a continuous single crystal semiconductor on said insulator body.

According to a second aspect of the present invention, there is also provided a method for fabricating a semiconductor device according to the method according to the first aspect described above, which is characterized by forming an insulating layer on said continuous single crystal semiconductor layer formed on said insulator body and repeating the four steps in the method according to the first aspect of the present invention.

According to a third aspect of the present invention, there is also provided a method for fabricating a semiconductor device comprising the steps of: forming a plurality of grooves of different cross sectional shapes spaced apart from each other on the surface of an insulator body; forming a polycrystalline or amorphous semiconductor layer on the surface of said insulator body including said grooves; irradiating parts of said semiconductor layer on said grooves with an energy beam to convert said parts into single crystals; and irradiating the remaining part of said semiconductor layer with said energy beam while displacing said energy beam to thereby sequentially form single crystals utilizing said single crystal semiconductor layer as a growing nucleus so as to form a plurality of single crystal semiconductor layers having different crystal planes on said insulator body.

BRIEF DESCRIPTION OF THE DRAWINGS

FIGS. 1 through 7 are sectional views illustrating an embodiment of the method for fabricating a semiconductor device according to the present invention;

DETAILED DESCRIPTION OF THE PREFERRED EMBODIMENTS

Figure 1:
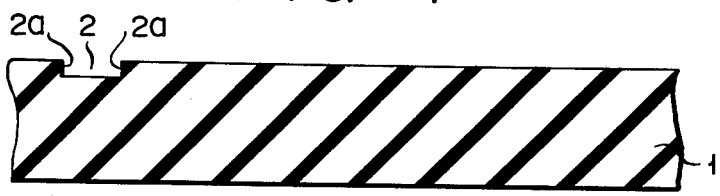

The insulator body to be used according to the present invention may be a silicon dioxide film, a silicon nitride film or the like formed on the surface of a silicon substrate or may be an insulating substrate of sapphire, spinel, glass or the like. According to the present invention, the groove or grooves are formed on a limited region of the surface of such an insulator body by etching employing the RIE method (reactive-ion etching method), the anisotropy etching method or the like in such a manner that the side walls of the groove or grooves form a constant angle with respect to the surface of the insulator body. Unlike the case of the graphoepitaxy method described above, only one groove is preferably formed and this groove is preferably formed at the periphery of the insulator body according to the present invention.

For the semiconductor layer deposited on the insulator body according to the present invention, any polycrystalline or amorphous semiconductor substance may be used which may be melted and resolidified and which forms single crystals upon irradiation by the energy beam. However, polycrystalline silicon or amorphous silicon is most preferable. This semiconductor substance is deposited on the insulator body by the CVD process, the PVD process or the like to form a polycrystalline or amorphous semiconductor layer. Before irradiating the semiconductor layer with an energy beam, it is preferable to ion-implant the entire surface of the semiconductor layer. When ion-implantation is performed, crystal defects are caused in the semiconductor layer which increase the absorption efficiency of energy upon irradiation by the energy beam. Since the implanted ions are to remain inside the semiconductor layer, the kind of ion to be implanted must be one which may not cause problems inside the semiconductor layer. Ions of an element contained in the semiconductor layer or of an inert element such as Ar may thus be used. When the semiconductor layer is to be given p-or n-type conductivity, a corresponding impurity element such as P, As or the like for the n-type conductivity and B or the like for the p-type conductivity may be used.

The energy beam to be used herein may be a laser beam, an electron beam, an X-ray beam or the like. When irradiating the polycrystalline or amorphous semiconductor layer with such an energy beam, the part of the semiconductor layer immediately on the groove is first irradiated with the energy beam to form a single crystal nucleus, and the part of the semiconductor layer adjacent to this part is then irradiated with the energy beam to grow single crystals. By repeating this operation, the entire area of the semiconductor layer is converted into single crystals utilizing the single crystal nucleus formed at the groove. However, it is also possible not to irradiate a predetermined part of the semiconductor layer with the energy beam in order to leave this part as a polycrystalline or amorphous part and to utilize this part as an element forming part of high resistance.

When the polycrystalline or amorphous semiconductor layer deposited on the insulator body is converted into single crystals as described above, the orientation of the crystal plane of the obtained single crystal layer is determined by the side walls of the groove. With a semiconductor substance having a diamond type crystal structure such as Si, Ge and so on, the crystal plane (001) is oriented in the direction perpendicular to the side walls of the groove. Therefore, with such a semiconductor substance, when the side walls of the groove form an angle of 90° with respect to the surface of the insulator body, the crystal plane (100) appears at the surface of the semiconductor layer. When the side walls of the groove form an angle of 45° with respect to the surface of the insulator body, the crystal plane (110) appears at the surface of the semiconductor layer.

The surface of the semiconductor layer converted into the single crystal layer by the method according to the present invention has a groove corresponding to the groove on the insulator body only on its limited area, and the rest of the surface is flat. Therefore, by utilizing the flat portion which occupies most of the surface of the single crystal semiconductor layer, photolithography may be performed in a well-controlled manner so that a semiconductor element, an electrode or the like may be formed with high precision, which is the objective product of the present invention. It is also possible to freely select the crystal plane which appears on the surface of the single crystal semiconductor layer by controlling the angle between the surface of the insulator body and the side walls of the groove formed on the insulator body.

When a sapphire substrate is used as the insulator body according to the present invention, a semiconductor device of SOS structure may be fabricated. In this case, since it is not necessary to epitaxially grow the semiconductor layer on the sapphire substrate, a sapphire substrate with a surface having crystal defects may be used. When the method of the present invention is practiced using as the insulator body a silicon dioxide film formed on the surface of a silicon substrate having a semiconductor element region, a semiconductor device may be fabricated which utilizes the single crystal silicon layer formed on the silicon dioxide film as a gate electrode or as wiring of low resistance.

An embodiment for fabricating a semiconductor device having a single crystal silicon layer formed on a glass substrate will now be described with reference to FIGS. 1 through 7.

(i) A groove 2 having a depth of 1,000 Å was formed on the surface of a glass substrate 1 by photolithography (FIG. 1). The groove 2 was so formed utilizing the RIE process (reactive-ion etching) that its side walls 2a form an angle of about 90° with respect to the surface of the glass substrate, as shown in the figure.

Figure 2:
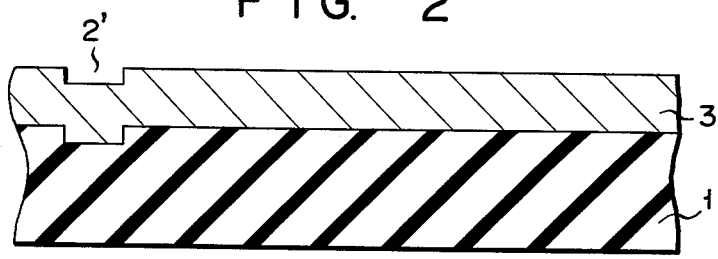

(ii) A polycrystalline silicon layer 3 having a thickness of 4,000 Å was formed on the glass substrate by the CVD process (FIG. 2). A groove 2' corresponding to the groove 2 of the glass substrate 1 was similarly formed on the polycrystalline silicon layer 3.

Figure 3:
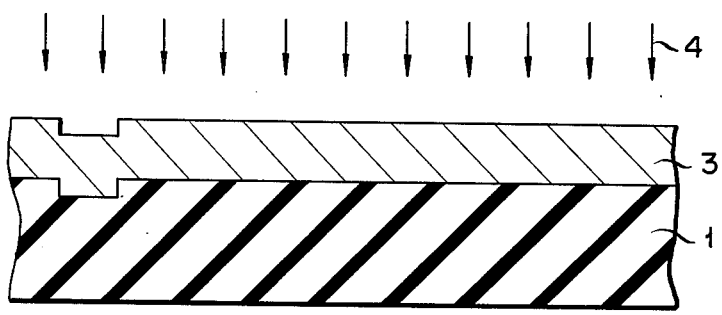

(iii) Silicon ions 4 were implanted at a density of $3 \times 10^{16}/cm^2$ and at an accelerating voltage of 200 KeV on the entire surface of the polycrystalline silicon layer 3 (FIG. 3).

Figure 4:
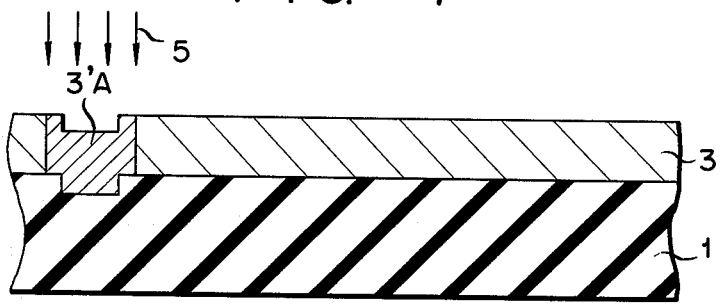

(iv) The groove 2' was irradiated with a laser beam 5, as shown in FIG. 4, to turn the polycrystalline silicon at this place into a single crystal silicon part 3'A. The single crystal silicon part 3'A formed by melting and resolidification within a very short period of time by the irradiation with the laser beam had the crystal plane (100) in the direction perpendicular to the surface of the glass substrate by the effects obtained by the side walls 2a forming an angle of 90° with respect to the surface of the glass substrate 1.

(v) The part of the polycrystalline silicon layer adjacent to the single crystal silicon part 3'A was then irradiated with the laser beam 5 to turn the polycrystalline silicon at this part into a single crystal silicon part 3'B, as shown in FIG. 5. During this procedure, the polycrystalline silicon melted by the irradiation of the laser beam crystallized according to the crystal orientation of the adjacent single crystal silicon part 3'A. Therefore, the single crystal silicon parts 3'A and 3'B were integrally formed as single crystals.

(vi) The parts adjacent to the single crystal part were sequentially irradiated with the laser beam to form an integral single crystal silicon layer 3' as a whole. (FIG. 6)

(vii) The single crystal silicon layer 3' formed on the glass substrate 1 and including the groove 2' was selectively oxidized to form an insulating film 6 for element separation. Impurity diffusion was then performed according to the usual method to form an arsenic-doped n+-type source region 7 and an arsenic-doped n+-type drain region 8. A gate electrode 10 was formed through a gate oxide film 9 on a channel region between these regions 7 and 8 to complete an MOS type IC.

In the embodiment described above, only a limited region of the single crystal silicon layer formed on the glass substrate has a groove; most of the surface of this layer is flat, allowing photolithography with good precision. Accordingly, an IC having a high performance MOS transistor with a desired channel size may be fabricated with ease.

Figure 8:
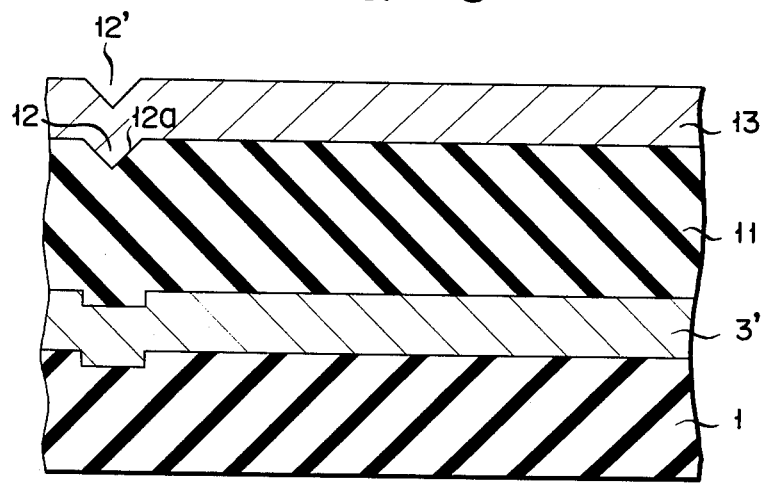
FIG. 8 is a sectional view illustrating another embodiment of the method of the present invention.

FIG. 8 is a sectional view showing another embodiment of the present invention. Referring to FIG. 8, reference numeral 3' denotes the single crystal silicon layer formed on the glass substrate 1 by performing the steps shown in FIGS. 1 through 6 in the embodiment described above. A silicon dioxide film 11 having a thickness of 1 μm was formed over the single crystal silicon layer 3' by the CVD process. A groove 12 having a V-shaped cross section was formed on the surface of the silicon dioxide film 11 by photolithography. Side walls 12a of the groove 12 formed an angle of about 45° with respect to the surface of the silicon dioxide film 11. A polycrystalline silicon layer 13 having a thickness of 4,000 Å was formed on the surface of the silicon dioxide film 11 having the groove 12 by the CVD process. During this procedure, a groove 12' corresponding to the groove 12 of the silicon dioxide film 11 was similarly formed on the surface of the polycrystalline silicon layer 13. The polycrystalline silicon layer 13 was then converted into a single crystal silicon layer (not shown) by performing substantially the same process of converting a polycrystalline silicon layer into a single crystal silicon layer as in the case of the former embodiment described above. The obtained single crystal silicon layer had the crystal plane (110) at the surface.

Insulating layers and single crystal layers may be alternately laminated one on the other by repeating the method used in this embodiment. Accordingly, it becomes possible to vertically construct a semiconductor device to thereby significantly improve integration of the semiconductor device.

Figure 9:
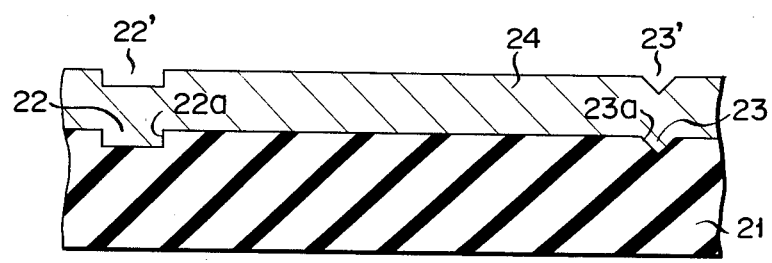
FIGS. 9 and 10 are sectional views showing still another embodiment of the method of the present invention.
Figure 10:
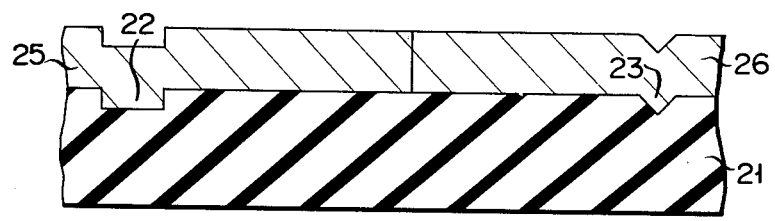

FIGS. 9 and 10 are sectional views showing still another embodiment of the present invention. Referring to these figures, reference numeral 21 denotes a glass substrate on the surface of which two grooves 22 and 23 spaced apart from each other were formed by photolithography. The groove 22 had a square-wave cross section. Side walls 22a of this groove 22 formed an angle of about 90° with respect to the surface of the glass substrate 21. The groove 23, on the other hand, had a V-shaped cross section, and its side walls 23a formed an angle of about 45° with respect to the surface of the glass substrate 21. A polycrystalline silicon layer 24 having a thickness of 4,000 Å was formed by the CVD process on the surface of the glass substrate 21 having these grooves 22 and 23. During this process, grooves 22' and 23' corresponding to the grooves 22 and 23 of the glass substrate 21 were similarly formed on the surface of the polycrystalline silicon layer 24. Substantially the same process for converting a polycrystalline silicon layer into a single crystal silicon layer as in the embodiments described above was performed to convert the polycrystalline silicon layer 24 into single crystal silicon layer 25 and 26 as shown in FIG. 10. The single crystal silicon layer 25 had the crystal plane (100) at the surface, due to the presence of the groove 22. The single crystal silicon layer 26 had the crystal plane (110) at the surface, due to the presence of the groove 23.

A plurality of single crystal semiconductor layers having different crystal planes may be fabricated on a single insulating substrate by the method of the present invention as exemplified in the above embodiment.

What is claimed is:

1. A method for fabricating a semiconductor device comprising the steps of:

forming a groove on the surface of an insulator body;

forming a polycrystalline or amorphous semiconductor layer on the surface of said insulator body including said groove;

irradiating part of said semiconductor layer formed on said groove with an energy beam to convert said part into single crystals; and irradiating the remaining part of said semiconductor layer with said energy beam while displacing the energy beam to thereby sequentially form single crystals utilizing said single crystal semiconductor layer as a growing nucleus so as to form a continuous single crystal semiconductor on said insulator body.

2. A method for fabricating a semiconductor device comprising the steps of:

forming a groove on the surface of an insulator body;

forming a polycrystalline or amorphous semiconductor layer on the surface of said insulator body including said groove;

irradiating part of said semiconductor layer formed on said groove with an energy beam to convert said part into single crystals;

irradiating the remaining part of said semiconductor layer with said energy beam while displacing the energy beam to thereby sequentially form single crystals utilizing said single crystal semiconductor layer as a growing nucleus so as to form a continuous single crystal semiconductor on said insulator body;

forming an insulating layer on said continuous single crystal semiconductor layer;

forming a groove on the surface of an insulating layer;

forming a polycrystalline or amorphous semiconductor layer on the surface of said insulating layer including said groove;

irradiating part of said semiconductor layer formed on said groove of said insulating layer with an energy beam to convert said part into single crystals; and irradiating the remaining part of said semiconductor layer with said energy beam while displacing the energy beam to thereby sequentially form single crystals utilizing said single crystal semiconductor layer as a growing nucleus so as to form a continuous single crystal semiconductor on said insulating layer.

3. A method for fabricating a semiconductor device comprising the steps of:

forming a plurality of grooves of different cross sectional shapes spaced apart from each other on the surface of an insulator body;

forming a polycrystalline or amorphous semiconductor layer on the surface of said insulator body including said grooves;

irradiating parts of said semiconductor layer on said grooves with an energy beam to convert said parts into single crystals; and irradiating the remaining part of said semiconductor layer with said energy beam while displacing said energy beam to thereby sequentially form single crystals utilizing said single crystal semiconductor layer as a growing nucleus so as to form a plurality of single crystal semiconductor layers having different crystal planes on said insulator body.

4. A method according to any one of claims 1 to 3, wherein ions are implanted in said polycrystalline or amorphous semiconductor layer before irradiation by said energy beam.

5. A method according to any one of claims 1 to 3, wherein, in the step of irradiating the remaining part of said semiconductor layer with said energy beam, selectively forming an insulating film for element separation by selectively irradiating the remaining part of said semiconductor layer with said energy beam.

6. A method according to any one of claims 1 to 3, wherein said energy beam is a laser beam, an electron beam, or an X-ray beam.

7. A method according to claim 1 or 3, wherein side walls of said groove formed on the surface of said insulator body form an angle of 90° or 45° with respect to the surface of said insulator body.

8. A method according to claim 2, wherein side walls of said grooves formed on the surfaces of said insulator body and said insulating layer, respectively, form an angle of 90° or 45° with respect to respective said surfaces.

* * * * *